(12) United States Patent
Tsai et al.

(10) Patent No.: US 12,094,567 B2
(45) Date of Patent: Sep. 17, 2024

(54) COMPUTER SYSTEM BASED ON WAFER-ON-WAFER ARCHITECTURE

(71) Applicant: WHALECHIP CO., LTD., Taipei (TW)

(72) Inventors: Kun-Hua Tsai, Taipei (TW); Yi-Wei Yan, Taipei (TW)

(73) Assignee: WHALECHIP CO., LTD., Taipei (TW)

( * ) Notice: Subject to any disclaimer, the term of this patent is extended or adjusted under 35 U.S.C. 154(b) by 182 days.

(21) Appl. No.: 17/960,821

(22) Filed: Oct. 6, 2022

(65) Prior Publication Data

US 2023/0119889 A1 Apr. 20, 2023

(30) Foreign Application Priority Data

Oct. 20, 2021 (TW) .................... 110138932

(51) Int. Cl.
*G11C 7/10* (2006.01)
*G11C 7/22* (2006.01)

(52) U.S. Cl.
CPC .......... *G11C 7/1093* (2013.01); *G11C 7/1057* (2013.01); *G11C 7/1096* (2013.01); *G11C 7/222* (2013.01)

(58) Field of Classification Search
CPC ... G11C 7/1093; G11C 7/1057; G11C 7/1096; G11C 7/222; G11C 7/1084; G11C 5/04; G11C 5/063; G11C 7/02; G11C 5/025
See application file for complete search history.

(56) References Cited

U.S. PATENT DOCUMENTS

2022/0199131 A1\* 6/2022 Kim .................... G06F 13/1689

\* cited by examiner

*Primary Examiner* — Xiaochun L Chen

(57) ABSTRACT

A computer system configured to overcome the conventional bottleneck of memory throughput. A wafer-on-wafer (WOW) technology is adapted to overcome the physical limitation of quantity and length in circuit deployments. The memory devices and the memory controllers in the logic circuit layer are improved to transmit data in differential signals. The differential signals can significantly reduce the error rate in high-speed transmissions, at a voltage level far lower than that of the conventional single-end signals. Thus, the power consumption of the computer system is significantly reduced. Furthermore, the memory controller in the computer system is improved to be an integrated controller having control over physical layer signals. Thereby, the conventional physical layer interface is no longer needed in the computer system, and therefore the cost to the computer system is further reduced.

10 Claims, 4 Drawing Sheets

COMPUTER SYSTEM BASED ON WAFER-ON-WAFER ARCHITECTURE

CROSS-REFERENCE TO RELATED APPLICATION

This application claims the priority benefit of Taiwanese Patent Application Serial Number 110138932, filed on Oct. 20, 2021, the full disclosure of which is incorporated herein by reference.

BACKGROUND

Technical Field

The present disclosure relates to the technical field of computer system, particularly to a wafer-on-wafer stacking architecture that transmits data signals between each layer of wafers with differential signals.

Related Art

In this era, the applications for artificial intelligence and blockchain have gradually being a brand new business opportunity. The blockchain can be widely used in the fields of smart contracts, digital identity, sharing economy, and other applications.

However, algorithms of some of the blockchain platforms are often changed for various security considerations or bug fixing. In addition to increasing the difficulty of computing, special designs are often deliberately made to reduce the computing efficiency of specific application chips (ASICs), for example, requirements that increase the memory throughput, or the capacity requirements to the storage device.

Thus, for developers of blockchain servers, it is necessary to change the hardware architecture to satisfy the high standard requirements for memory throughput. So, a new hardware architecture for the blockchain server is yet to be developed.

SUMMARY

The present disclosure provides a computer system that can overcome the throughput bottleneck of conventional memories. The main feature is a wafer-on-wafer stacking architecture that breaks through the limitation of the quantity and length of wiring and improves the memory device and memory controller to transmit data with differential signal technology. Differential signals can be transmitted at high speed with very low error rates and require much lower electric voltages than conventional single-ended signals. So, the power consumption of the overall device can be significantly reduced and the performance can be significantly improved. Further, the present disclosure improves the memory controller of a computer system into an integrated controller and also integrates the function of physical layer signal control in addition to the original functions of the controlling memory. The improved integrated controller can directly control the memory device without the physical layer controller of conventional techniques, so the cost of implementing a computer system would also be reduced.

In an embodiment of a computer system, a memory crystal layer and a logic circuit layer are included, forming a wafer-on-wafer stack with the memory crystal layer. The memory crystal layer comprises a plurality of memory devices for storing data. The logic circuit layer comprises a signal interface coupled to the memory devices for converting the format of the signal transmitted from the logic circuit layer to the memory crystal layer into differential signals and converting the format of the signal transmitted from the memory crystal layer to the logic circuit layer into a single-ended signal. A plurality of bounding pads are disposed between the memory crystal layer and the logic circuit layer, which are used as channels for the signal interface to transmit signals.

Each of the memory devices comprises a plurality of memory arrays, which comprises a plurality of memory cells. A line driver connected to the memory arrays can receive control signals from the logic circuit layer to enable the memory arrays to input or output data. Signals are transmitted between the line driver and the signal interface through the bounding pads, and the format of the transmitted signals are differential signals.

A first logic circuit is disposed in the logic circuit layer that can access a first memory device of the memory devices. An integrated controller connected to the first logic circuit and the signal interface can convert a first access request of the logic circuit to the first memory device into a first memory management command of a physical layer signal format that can be transmitted to the first memory device through the signal interface.

In further embodiments of the logic circuit layer, conventional memory access mechanisms could exist concurrently. For example, a second logic circuit is disposed in the logic circuit layer that uses conventional memory controllers and physical layer controllers to access a second memory device of the memory devices. The memory controller is connected to the second logic circuit and can convert a second access request of the logic circuit to the second memory device into a second memory management command. The physical layer controller connecting to the memory controller and the signal interface can convert the second memory management command into the physical layer signal format that can be transmitted to the second memory device through the signal interface.

In one embodiment of a signal interface, a plurality of differential transmitters and a plurality of differential receivers are included. Each of the differential transmitters connected to two of the bounding pads can convert the format of the signals transmitted from the first logic circuit and the second logic circuit respectively to the first memory device and the second memory device into differential signals. Each of the differential receivers connected to one of the bounding pads can convert the format of the signals transmitted from the first memory device and the second memory device respectively to the first logic circuit and the second logic circuit into single-ended signals.

In an embodiment of an integrated controller, an encoder, a command processing module, and a command channel are included. The encoder can receive and encode the first access request transmitted by the first logic circuit. The first access request comprises a command signal, and when the command signal is a write command, the first logic circuit would also transmit a write data signal. The command processing module is connected to the encoder and can buffer, queue, and schedule the command signal according to a memory management protocol, for controlling the first memory device. The command channel is connected to the command processing module, which can convert the command signal into the physical layer signal format that can be transmitted to the first memory device through the signal interface. The command signal can be an array control signal in the memory control protocol defined by the Solid State Technology Association (JEDEC). For example, one or more of the chip select signal (CS), write enable signal (WE), column address strobe signal (CAS), row address strobe signal (RAS), and address signal, etc.

In a further embodiment of the integrated controller, a write data processing module and a data channel are included. The write data processing module is connected to the encoder, which can buffer the write data and control the transmission schedule. The data channel is connected to the write data processing module, which can convert the write data into the physical layer signal format that can be transmitted to the first memory device through the signal interface.

The data channel can further receive a read data output from the second memory device. In a further embodiment of the integrated controller, a read data processing module may be included, which can be connected to the data channel, buffer the read data, and schedule the timing of outputting the read data to the first logic circuit.

The integrated controller could further comprise a timing manager for providing a timing signal, and for connecting and managing the encoder, the command processing module, the write data processing module, the read data processing module, the command channel, and the clock synchronization and traffic scheduling of the data channel.

Thus, the computer system proposed in the present disclosure can overcome the throughput bottleneck of conventional memories. In addition to the wafer-on-wafer stacking architecture that breaks through the limitation of the quantity and length of wiring, the memory device, and memory controller have also been improved to transmit data with differential signal technology. Since the differential signals can be transmitted at high speed with a very low error rate, and the electric voltage required is much lower than conventional single-ended signals, the power consumption of the overall device can be significantly reduced and the performance can be significantly improved. Moreover, the present disclosure modifies the memory controller of a computer system to an integrated controller, which also integrates the function of physical layer signal control in addition to the original function of the control memory. Since the improved integrated controller can directly control the memory device without the physical layer controller of conventional techniques, the cost of implementing a computer system can also be reduced.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
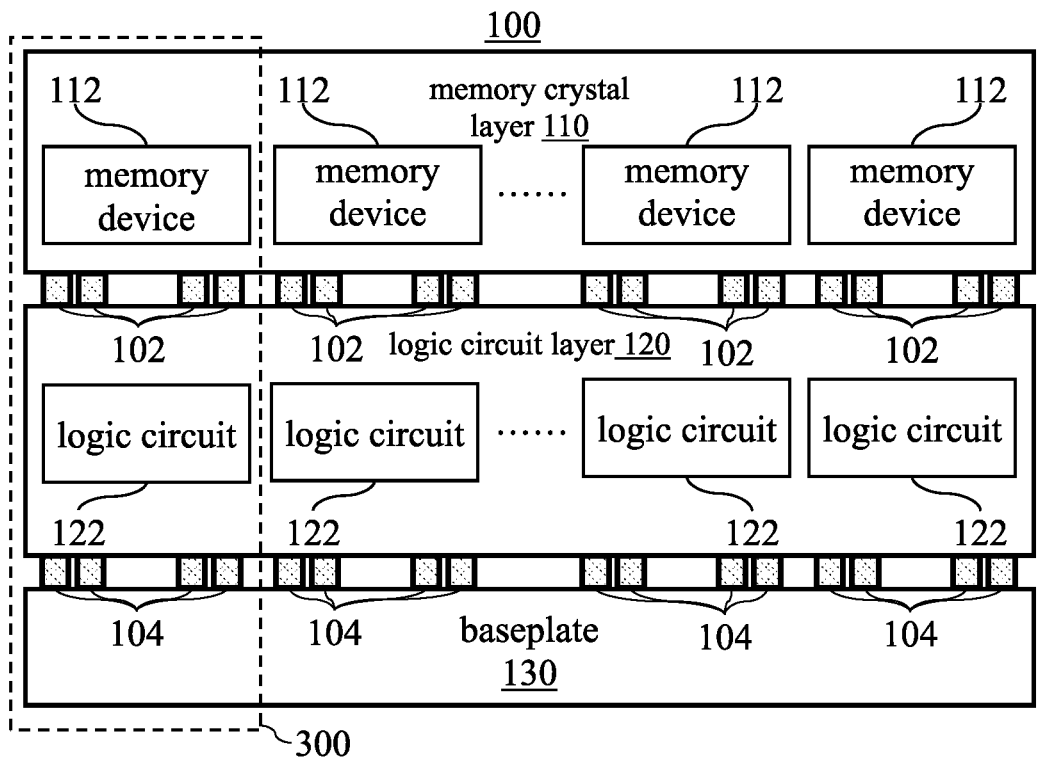
FIG. 1 is a schematic diagram of a wafer-on-wafer stacking architecture.

A three-dimensional wafer product 100 is formed by stacking at least a memory crystal layer 110, a logic circuit layer 120, and a baseplate 130 layer by layer. In addition to providing basic support, the baseplate 130 also provides additional wiring space. A plurality of bounding pads 102 or 104 are disposed between the layers to provide signal channels. The three-dimensional wafer product 100 of this embodiment is a semi-finished product of a computer system 300, and after dicing, a plurality of independent operating computer systems 300 can be formed. As shown in FIG. 1, each computer system 300 may comprise a plurality of memory devices 112 and a plurality of logic circuits 122 that have the same three-dimensional wafer architecture. In other words, the memory devices 112 and the logic circuits 122 in each of the computer systems 300 are respectively disposed in the memory crystal layer 110 and the logic circuit layer 120 in advance, then form a three-dimensional configuration by stacking. In the three-dimensional configuration, the circuit wires between the wafer groups do not need to occupy an extra area, and thousands of bounding pads 102 and 104 can be directly used as signal transmission paths. In this way, the performance issue of data transmission can be effectively solved, thereby realizing the computer system 300 of the present disclosure.

In the wafer-on-wafer architecture of FIG. 1, since the quantity of transmission lines is no longer limited by the design in a plane, a large number of dedicated wires can be used to solve the performance problem of data transmission. The distance between the memory crystal layer 110 and the logic circuit layer 120 is reduced so that more interfaces can be arranged in the same area. A bandwidth can be obtained from a formula by multiplying the number of interfaces by the frequency of the channel, so there would be more interfaces having higher bandwidth. Due to the WOW stacking technology, the embodiments of the present disclosure now have the opportunity to be realized.

Figure 2:
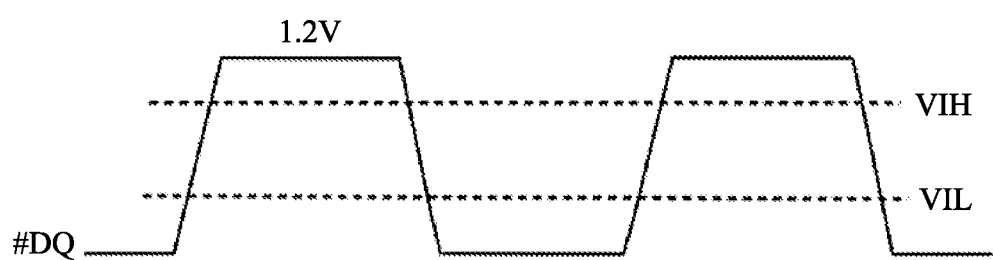
FIG. 2 is a timing diagram of conventional single-ended signal transmission.

FIG. 2 is a timing diagram of a conventional single-ended signal transmission. The signals transmitted between the memory device 112 and the logic circuit 122, such as data signals #DQ, are single-ended signals passed through the bounding pads 102. As shown in FIG. 2, the DQ signal is a square wave with a swing amplitude of 1.2 volts. When the signal level exceeds the first threshold VIH, it would be determined as 1, and when the signal level is lower than the second threshold VIL, it would be determined as 0. However, as the production process of wafers advances, the circuit density is increased and so is the requirement for operating frequency. The conventional architecture of FIG. 2 increases noise and power consumption when the operating frequency is increased. So, an improved signal transmission method needs to be developed. In the embodiment of the present disclosure, the signal transmission format between the memory device 112 and the logic circuit 122 is changed to a differential signal. To realize the transmission of differential signals, various detailed architectural improvements are described below.

Figure 3:
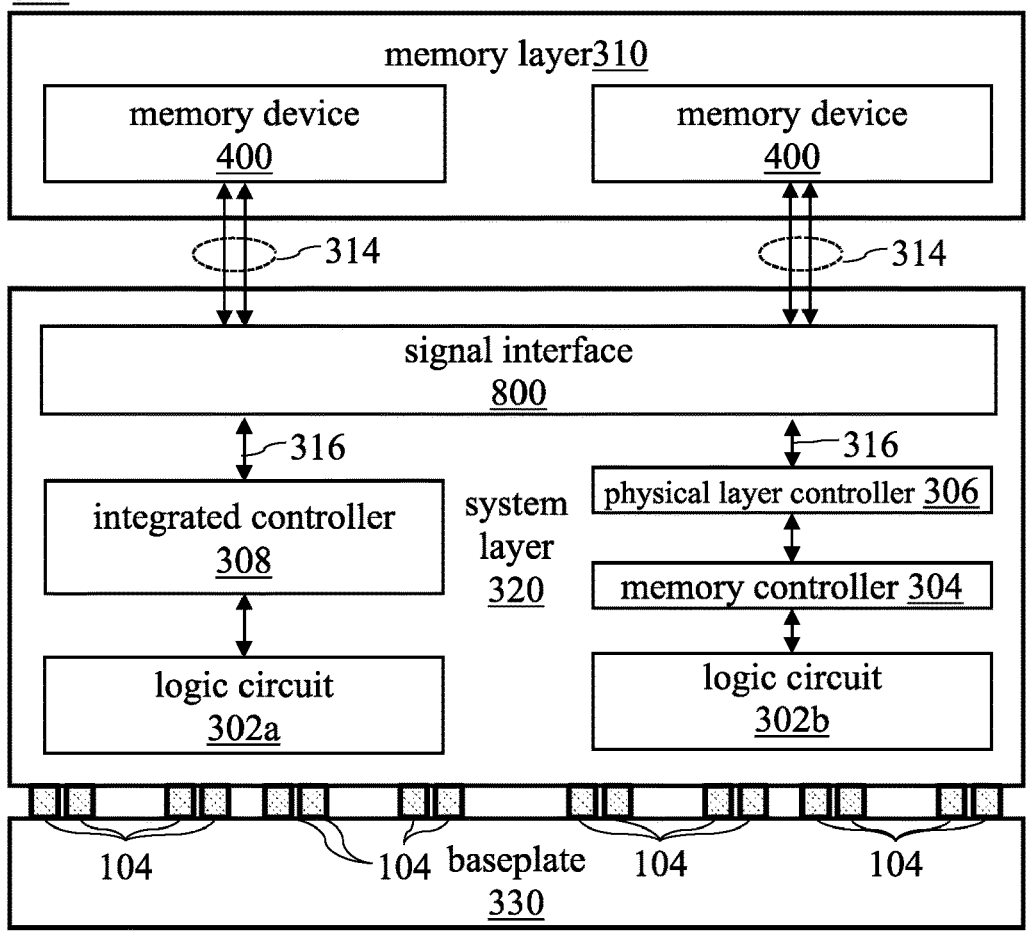
FIG. 3 is a structural diagram of a computer system 300 according to an embodiment of the present disclosure.

FIG. 3 is a structural diagram of a computer system 300 according to an embodiment of the present disclosure. To overcome the throughput bottleneck of conventional memories, in this embodiment, a wafer-on-wafer architecture is applied to break through the limitation of the quantity and length of wirings. In the three-dimensional wafer product 100 shown in FIG. 1, when the wafer-on-wafer stacking process is completed, the wafer dicing process is further performed to form a plurality of computer systems 300. On a baseplate 330 in the computer system 300 of this embodiment, a memory layer 310 and a system layer 320 correspondingly diced from the memory crystal layer 110 and the logic circuit layer 120 are disposed. The memory layer 310 comprises a plurality of memory devices 400 for storing data. In the present embodiment, the memory device 400 is also improved to transmit data with differential signals 314. The differential signals 314 can transmit at high speed with a very low error rate and requires a much lower voltage than conventional single-ended signals. For example, the system layer 320 comprises a signal interface 800 coupled to the memory devices 400, which can convert a single-ended signal 316 transmitted from the system layer 320 to the memory layer 310 into a differential signal 314 for transmission, and can further convert the differential signal 314 transmitted from the memory layer 310 to the system layer 320 into a single-ended signal 316 that can be used in the system layer 320. The memory layer 310 and the system layer 320 in FIG. 3 are also connected by a plurality of bounding pads 102 as shown in FIG. 1 (not shown). Besides, in addition to providing support, the baseplate 330 shown in FIG. 3 can also provide additional three-dimensional wiring space through a large number of bounding pads 104 so that the circuit layout inside the system layer 320 could be more efficient. Since there would be fewer concerns on layout area and line length, the wafer-on-wafer stacking architecture may allow the arrangement of a large number of bounding pads 102 and 104. Although the differential signals 314 require double the quantity of lines, it can still be easily implemented.

Due to the wafer-on-wafer architecture that allows the arrangement of a large number of interfaces, the number of physical layer controllers 306 increases, thereby occupying more area of the system layer 320. The system layer 320 comprises a logic circuit 302a that can access at least one memory device 400 in the memory layer 310. In this embodiment, the conventional memory controller is modified into an integrated controller 308 connected to the logic circuit 302a and the signal interface 800, which can convert an access request coding transmitted from the logic circuit 302a into a memory management command for accessing the memory device 400. The memory management command has a signal format that can be transmitted directly at the physical layer, which can be directly converted into the differential signal 314 by the signal interface 800 and then transmitted to the memory device 400 without the conventional physical layer controller 306.

The physical layer signal format mentioned in this embodiment is a mechanism to ensure the correct transmission of electronic signals. Any signal transmitted from the logic circuit 302a to the memory device 400, whether a command signal or a data signal, is essentially a stream of electronic bits 0 and 1 from the perspective of the physical layer. The method of converting signals to the physical layer signal format, for example, is to segment these electronic bit streams into signal packets and attach check bits to each signal packet. When errors are detected during transmission, retransmission mechanisms and flow rate control can also be implemented. Some physical layer communication protocols already exist in conventional technology, such as the dual-channel memory physical layer interface protocol (DDR PHY Interface; DFI). In the embodiments of the present disclosure, the originally independent physical layer controller circuit and the memory controller are integrally designed to omit redundant components and circuit designs required for inter-chip communication. The integrated controller 308 can directly support conventional DFI protocol, realizing memory control and physical signal transmission without additional implementation of a physical layer controller.

In a further embodiment of the system layer 320, conventional memory access mechanisms may be present concurrently. For example, the system layer 320 comprises a logic circuit 302b that uses the conventional memory controller 304 and the physical layer controller 306 to access one or more of the memory devices 400 in the memory layer 310. The memory controller 304 connected to the logic circuit 302b can convert the access request of the logic circuit 302b to a memory device 400 into a memory management command. The physical layer controller 306 connected to the memory controller 304 and the signal interface 800 can convert the memory management command into a physical layer signal format that can be transmitted to the memory device 400 to be accessed through the signal interface 800.

A plurality of logic circuits is included in an embodiment of FIG. 3, each of which has different functions. All these logic circuits may all use the integrated controller 308 to replace the memory controller 304 and the physical layer controller 306 to access the memory device 400. On the other hand, two types of architectures with/without the physical layer controller 306 can also coexist. For example, since each logic circuit is responsible for different functions, the requirements for memory are also different. Some applications only require a small amount of access and do not need a fast response speed, so the conventional memory controller 304 and the physical layer controller 306 can be used. Some applications may require numerous and frequent accesses, requiring multiple memory controllers to be used simultaneously, and/or each memory controller could control multiple memory devices simultaneously. In this case, processing the memory access with the integrated controller 308 can not only simplify the circuit configuration but also can customize a flexible memory processing method. That is, the integrated controller 308 not only combines the conventional memory controller and the physical layer controller into a new architecture but also realizes the multiplexing goal of simultaneously controlling multiple groups of memory devices by one logic circuit.

Figure 4:
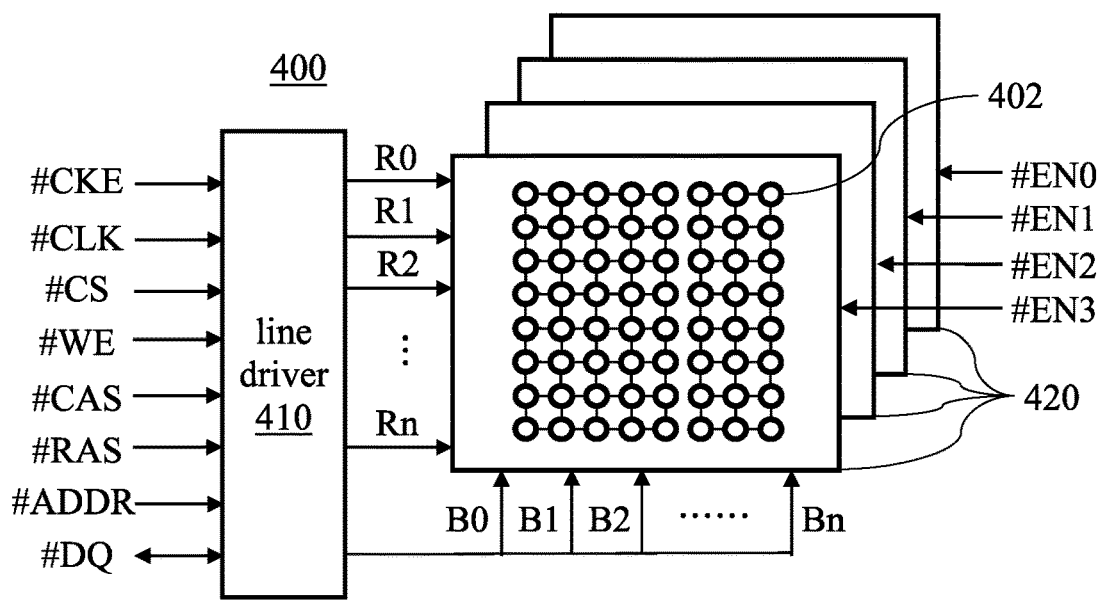
FIG. 4 is a structural diagram of a memory device 400 according to an embodiment of the present disclosure.

FIG. 4 is a structural diagram of a memory device 400 according to an embodiment of the present disclosure. In each memory device 400, a plurality of memory arrays 420 are included. Each of the memory arrays 420 comprises a plurality of memory cells 402. A line driver 410 connected to the memory arrays 420 can receive control signals from the system layer 320 to allow the memory arrays 420 to input or output data. In this embodiment, signals are transmitted between the line driver 410 and the signal interface 800 through the bounding pads 102 shown in FIG. 1, and the format of the transmitted signals is the differential signal 314. The detailed operation principle of the memory device 400 of this embodiment can be a memory module designed in accordance with the JEDEC protocol. For example, the line driver 410 could be a collective name of a plurality of data drivers and a plurality of address decoders. A column of memory cells 402 in the memory array 420 is activated by receiving the address signals RO to Rn output from the address decoder, and simultaneously reads or writes multi-bit data in conjunction with the data signals BO to Bn output from the data driver. Since the computer system 300 of this embodiment transmit signals with the differential signal 314, the line driver 410 could receive various memory control signals from the signal interface 800. For example, clock enable signal #CKE, clock signal #CLK, chip select signal #CS, write enable signal #WE, column address strobe signal #CAS, column address strobe signal #RAS, address signal #ADDR, and data signal #DQ can be in the form of differential signals. So, in addition to the conventional data driver and address decoder, the line driver 410 also comprises one or more groups of differential signal transceivers (not shown) to convert the differential signal 314 received from the outside of the memory device 400 into a single-ended signal suitable for the internal operation of the chip, or to convert the signal transmitted to the system layer 320, such as read data, into a differential signal 314, and then transmit it to the inside of the system layer 320 through the signal interface 800. By implementing low-power and high-bandwidth differential signal transmission on the wafer-on-wafer stacking architecture, the transmission speed can be increased from hundreds of MHz to more than 3 GHz.

In the embodiment of FIG. 4, each memory array 420 may also be referred to as a memory matrix (BANK), the operation of which may be controlled by the array select signals #EN0 to #EN3. The structure shown in FIG. 4 is only an example. In production, the quantity of the memory array 420 and the line driver 410 is not limited to one, and the connection relationship between them is not limited to one-to-one or multiple-to-multiple correspondence. Thus, the line driver in the memory device is an improved component supporting the differential signal transmission.

Figure 5:
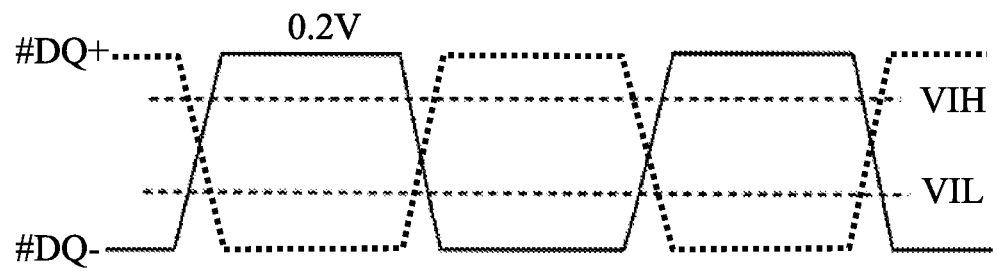
FIG. 5 is a timing diagram of differential signal transmission according to an embodiment of the present disclosure.

FIG. 5 is a timing diagram of differential signal transmission according to an embodiment of the present disclosure. Compared with the single-ended signal transmission shown in FIG. 2, the data signal #DQ in FIG. 5 is changed to a form of differential signal, i.e., having waveforms #DQ+ and #DQ−, whose positive and negative polarities are always complementary transmitted synchronously with a voltage swing of 0.2 volts. It should be understood that the positive and negative signs are only used to represent that the differential signals comprise two signals of positive and negative complements, which are not absolute positive and negative voltage values. Differential signals could enable lower operating voltages and lower power consumption. Under the architecture that realizes a great number of interfaces, the power consumption and waste heat dissipation of wafer-on-wafer stacking can be effectively avoided. Besides, the differential signals can also increase the transmission frequency by several times, and reduce the error rate by several times, so that the memory access efficiency would be significantly improved. It should be understood that the differential signal timing diagram shown in FIG. 5 is only for signal transmission and does not function as encoding and decoding.

Figure 6:
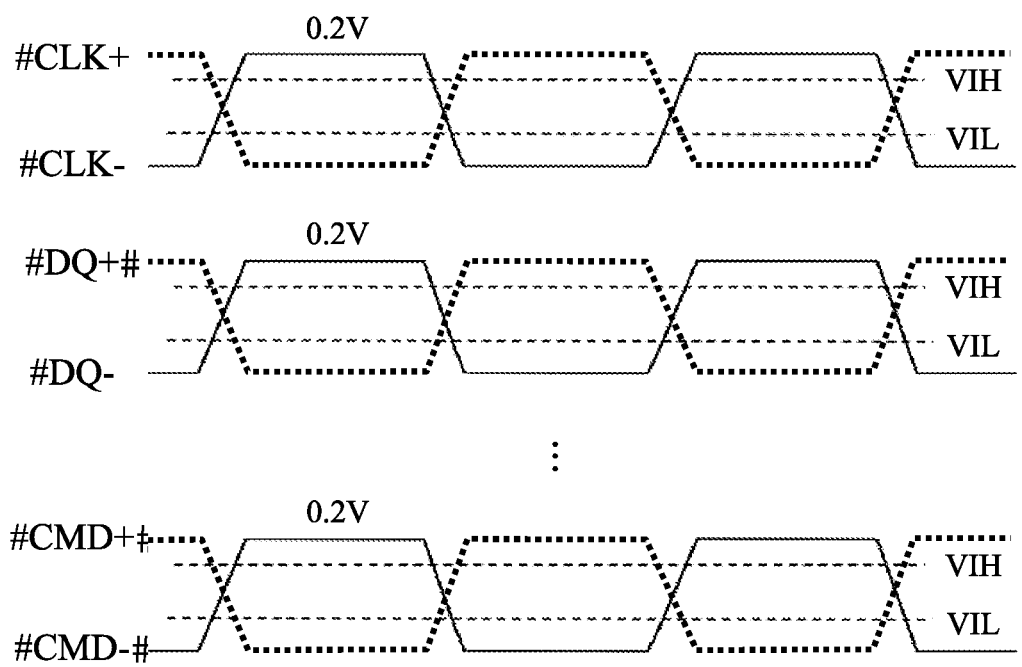
FIG. 6 is a timing diagram of differential signal transmission according to another embodiment of the present disclosure.

FIG. 6 is a timing diagram of differential signal transmission according to another embodiment of the present disclosure. Except for the data signal #DQ, any signal transmitted between the memory layer 310 and the system layer 320 can be changed to the form of the differential signal 314 as required. Although the method with the differential signal 314 requires twice the number of wires, since the present embodiment is designed based on the wafer-on-wafer stacking architecture, the achievable wire quantity is more than doubled that of the conventional technology. In addition to the data signal #DQ shown in FIG. 5, the embodiment of FIG. 6 is extended to convert any signal to a differential signal 314. For example, clock signals #CLK+ and #CLK−, and command signals #CMD+ and #CMD−. The command signals #CMD+ and #CMD− generally refer to differential forms of various signals used to control the memory device 400. The various signals can be clock enable signal #CKE, chip select signal #CS, write enable signal #WE, column address strobe signal #CAS, row address strobe signal #RAS, or address signal #ADDR, etc.

Figure 7:
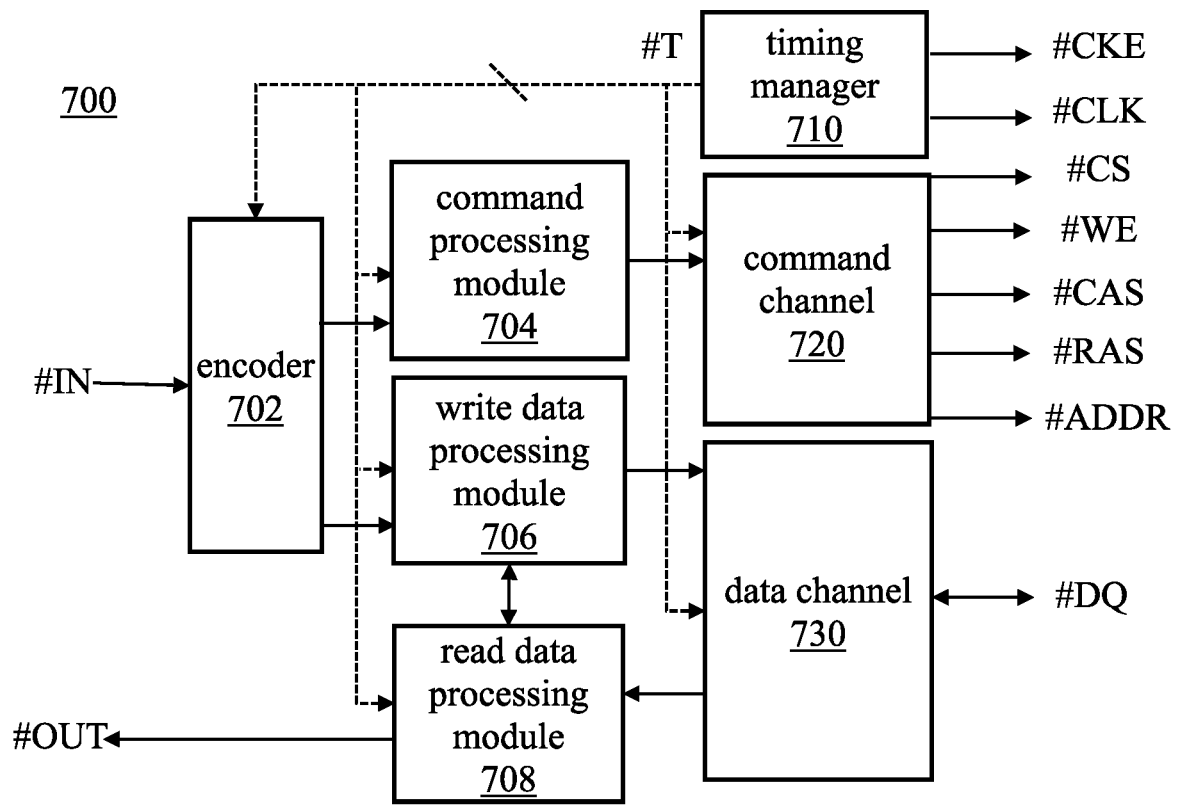
FIG. 7 is a structural diagram of an integrated controller 700 according to an embodiment of the present disclosure.

FIG. 7 is a structural diagram of an integrated controller 700 according to an embodiment of the present disclosure, which specifically illustrates a detailed operation of the integrated controller 700 in FIG. 3. The left side of the integrated controller 700 connected to one of the logic circuits in the system layer 320 receives the access request #IN from the logic circuit, and transmits an output signal #OUT to the logic circuit. For example, when the logic circuit needs to read data from a memory device 400, it can issue a read request, at this time, the access request #IN refers to the read request, and the output signal #OUT refers to the requested data. On the other hand, when the logic circuit needs to write data to the memory device 400, it can issue a write request and transmit the data to be written, at this time, the access request #IN comprises the write request and the data body to be written. The specific working mode of the integrated controller 700 can basically comply with the JEDEC protocol. The improvement of this embodiment is that the dual-channel memory physical layer interface protocol DFI is directly implemented in the integrated controller 700 so that the integrated controller 700 does not need to be connected to the memory device 400 through a physical layer controller 306.

In an embodiment of an integrated controller, an encoder 702, a command processing module 704, and a command channel 720 may be included. The encoder 702 can receive and encode the access request #IN transmitted by the logic circuit 302a as a command signal. The command processing module 704 connected to the encoder 702 can buffer, queue, and schedule the command signal according to the memory management protocol for later steps related to controlling the memory device 400. The command channel 720 connected to the command processing module 704 and can convert the command signal into the physical layer signal format to transmit to the memory device 400 through the signal interface 800. The command signal can be the signal format in the JEDEC memory control protocol. For example, one or more of chip select signal #CS, write enable signal #WE, column address strobe signal #CAS, row address strobe signal #RAS, and address signal #ADDR.

When the access request #IN is a write request and comprises data to be written, the data to be written is also translated into a write data signal that can be transmitted to a write data processing module 706 and a data channel 730. The write data processing module 706 is connected to the encoder 702 to buffer the write data and control the transmission schedule. The data channel 730 connected to the write encoder 702 can convert the write data into the physical layer signal format that can be transmitted to the memory device 400 through the signal interface 800. In this embodiment, the data channel 730 can be a bidirectional component, i.e., can be used for reading or writing. Under different circumstances, the data signal #DQ transmitted by the data channel 730 to the memory device 400 may represent a reading or writing of data. For example, when the logic circuit issues a data read request, the data channel 730 can further receive data output from the corresponding memory device 400. A read data processing module 708 in the integrated controller is connected to the data channel 730, and buffers the read data and schedules the timing of outputting the read data to the logic circuit 302a.

In a further embodiment, a direct communication connection can also be established between the write data processing module 706 and the read data processing module 708 to quickly process some specific commands. For example, the Read-Modify-Write (RMY) is a specific instruction set that comprises three actions: read, modify, and write. This instruction set can be used when only a small number of bits in a piece of data need to be modified so that the three actions can be completed in the integrated controller 700 at one time without a detour through logic circuits or core processors for processing.

Although not shown in the figure, the data channel may comprise a plurality of channels corresponding to different memory devices 400 or memory arrays 420 respectively. The command channel 720 and the data channel 730 could implement a transmission error prevention mechanism, such as the dual channel memory physical layer interface protocol (DFI). For example, before the command signal and data signal #DQ are output, the integrated controller 700 can implement segmentation of the bit stream, additional error checking bits, error retransmission mechanisms, and traffic regulation. It should be understood that although the memory management protocol and transmission error prevention mechanism are described in a functional way, any algorithm in present days can be implemented in the form of a logic circuit, when describing functional modules in this embodiment, it is unnecessary to describe the details of the circuit design.

Since the configuration of the integrated controller 700 can operate beyond extremely high transmission frequencies, a timing management mechanism that integrates the operation of multiple modules is necessary. The integrated controller 700 further comprises a timing manager 710, which provides a timing signal #T to connect and manage the encoder 702, the command processing module 704, the write data processing module 706, the read data processing module 708, the command channel 720, and the clock synchronization and traffic scheduling of the data channel 730. The timing manager 710 can also directly transmit the clock enable signal #CKE and the clock signal #CLK to the memory layer 310. The timing signal #T is not only a basic unit for clock synchronization, but also plays a role in scheduling and flow control. Under different read and write conditions, the timing manager can speed up the operation of some modules, slow down the operation of some modules, and even temporarily stop the operation of some modules. For example, multiplexers can be implemented in the command channel 720 and the data channel 730 to connect to a plurality of different memory devices 400 or memory arrays 420 simultaneously. Each memory device 400 in the memory layer 310 may have different latency characteristics due to different array dimensions. At this time, the timing manager 710 can provide a flexible adjustment capability, so that the integrated controller 700 can be adaptively connected to various memory devices 400 and operate smoothly.

Figure 8:
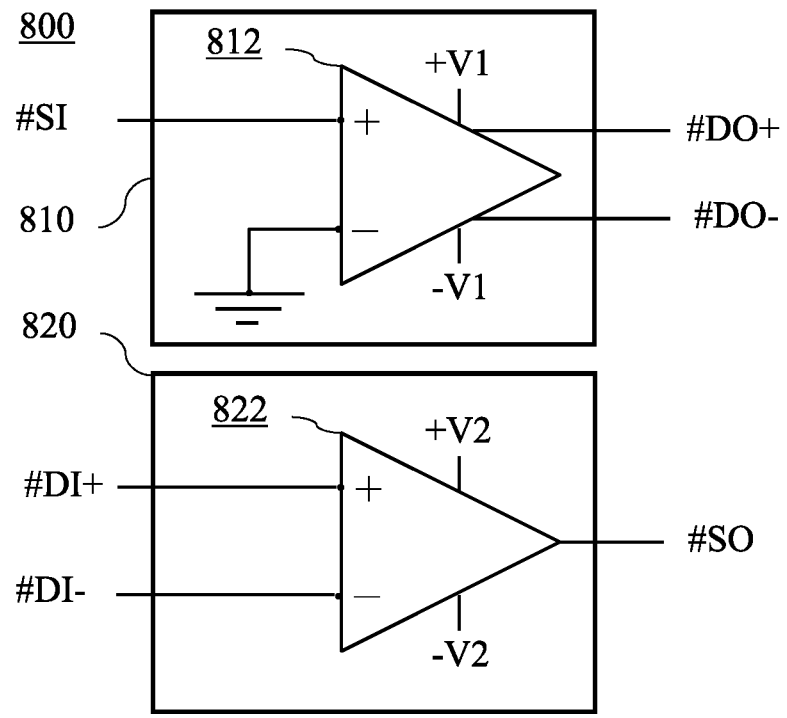
FIG. 8 is a structural diagram of a signal interface 800 according to an embodiment of the present disclosure.

FIG. 8 is a structural diagram of a signal interface 800 according to an embodiment of the present disclosure. In an embodiment of the signal interface 800, a plurality of differential transmitters 810 and a plurality of differential receivers 820 are included. Each of the differential transmitters 810 connected to two of the bounding pads 102 can convert the format of input single-ended signals #SI transmitted from the logic circuit 302a and the logic circuit 302b to the corresponding memory device 400 into differential output signals #DO+ and #DO−. Each of the differential receivers 820 connected to one of the bounding pads 102 can convert the format of the differential input signals #DI+ and #DI− transmitted from the memory device 400 and the corresponding memory device 400 to the logic circuit 302a and/or the logic circuit 302b into the single-ended output signals #SO. The differential transmitter 810 and the differential receiver 820 can be specifically implemented by at least one operational amplifier 812 and 822, and can be matched with different ranges of operating voltages +V1 to −V1 and +V2 to −V2 to realize the conversion of the output voltage range. It can be understood that the circuit models shown in the differential transmitter 810 and the plurality of differential receivers 820 in this embodiment are for illustration only, there are already many existing products that can meet the environmental requirements of low voltage and high speed in actual circuit design. The differential transmitter 810 and the plurality of differential receivers 820 can be implemented not only in the signal interface 800, but also in the line driver 410 of FIG. 4, which could form a corresponding transmission and receiving circuit configuration with the signal interface 800 so that data can be transmitted in the form of differential signals in between.

In summary, embodiments of the present disclosure provide a computer system that can overcome the throughput bottleneck of conventional memories. In addition to the wafer-on-wafer stacking architecture that breaks through the limitation of the quantity and length of wiring, the memory device and memory controller have also been improved to transmit data with differential signal technology. Since the differential signals can be transmitted at high speed with a very low error rate, and the electric voltage required is much lower than conventional single-ended signals, the power consumption of the overall device can be significantly reduced and the performance can be significantly improved. Moreover, the present disclosure modifies the memory controller of a computer system to an integrated controller, which also integrates the function of physical layer signal control in addition to the original function of the control memory. Since the improved integrated controller can directly control the memory device without the physical layer controller of conventional techniques, the cost of implementing a computer system can also be reduced.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A computer system, comprising:
    a memory crystal layer comprising a plurality of memory devices for storing data;
    a logic circuit layer comprising a plurality of logic circuits, the logic circuit layer and the memory crystal layer forming a wafer-on-wafer stack; and
    a plurality of bounding pads interconnected between the memory crystal layer and the logic circuit layer for differential signal transmission.

2. The computer system according to claim 1, wherein the logic circuit layer comprises:
    a signal interface coupled to the memory devices for converting the format of the signals transmitted from the logic circuit layer to the memory crystal layer into differential signals and converting the format of the signals transmitted from the memory crystal layer to the logic circuit layer into single-ended signals; and
    a plurality of memory arrays comprising:
        a plurality of memory cells; and
        a line driver connected to the memory arrays for receiving control signals from the logic circuit layer to enable the memory arrays to input or output data;
    wherein signals are transmitted between the line driver and the signal interface through the bounding pads; the transmitted signal is in a format of differential signal.

3. The computer system according to claim 2, wherein the logic circuit layer further comprises:
    a first logic circuit accessing a first memory device of the memory devices; and
    an integrated controller connecting to the first logic circuit and the signal interface; the integrated controller converts a first access request of the logic circuit to the first memory device into a first memory management command in a physical layer signal format to be transmitted to the first memory device through the signal interface.

4. The computer system according to claim 3, wherein the logic circuit layer further comprises:
    a second logic circuit accessing a second memory device of the memory devices;
    a memory controller connected to the second logic circuit; the memory controller converts a second access request of the logic circuit to the second memory device into a second memory management command; and
    a physical layer controller connected to the memory controller and the signal interface; the physical layer controller converts the second memory management command into the physical layer signal format to be transmitted to the second memory device through the signal interface.

5. The computer system according to claim 4, wherein the signal interface comprises:
    a plurality of differential transmitters, each of which connects two of the bounding pads to convert the format of signals transmitted from the first logic circuit and the second logic circuit to the first memory device and the second memory device into differential signals; and
    a plurality of differential receivers, each of which connects to one of the bounding pads to convert the format of the signals transmitted from the first memory device and the second memory device to the first logic circuit and the second logic circuit into single-ended signals.

6. The computer system according to claim 4, wherein the integrated controller comprises:
    an encoder receiving and encoding the first access request transmitted by the first logic circuit; the first access request comprises a command signal;
    a command processing module connected to the encoder; the command processing module buffers, queues, and schedules the command signal according to a memory management protocol; and
    a command channel connected to the command processing module for converting the command signal into the physical layer signal format to be transmitted to the first memory device through the signal interface.

7. The computer system according to claim 6, wherein the command signal comprises one or more of the following: chip select signal, write enable signal, column address strobe signal, row address strobe signal, and address signal.

8. The computer system according to claim 7, wherein the integrated controller further comprises:
    a write data processing module connected to the encoder; the write data processing module buffers a write data and controls the transmission schedule; and
    a data channel connected to the write data processing module; the data channel converts the write data into the physical layer signal format to be transmitted to the first memory device through the signal interface.

9. The computer system according to claim 8, wherein the data channel further receives a read data output from the second memory device; the integrated controller further comprises:
 a read data processing module connected to the data channel; the read data processing module buffers the read data and schedules the timing of outputting the read data to the first logic circuit.

10. The computer system according to claim 9, wherein the integrated controller further comprises a timing manager providing a timing signal; the integrated controller connects and manages the encoder, the command processing module, the write data processing module, the read data processing module, the command channel, and clock synchronization and traffic scheduling of the data channel.

* * * * *